(12) United States Patent
Chen et al.

(10) Patent No.: US 7,087,363 B2
(45) Date of Patent: Aug. 8, 2006

(54) METHOD OF FORMING A TOP GATE THIN FILM TRANSISTOR

(75) Inventors: Chih-Chiang Chen, Ilan (TW);
Ching-Sang Chuang, Hsinchu (TW);
Jiun-Jye Chang, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 336 days.

(21) Appl. No.: 10/650,977

(22) Filed: Aug. 29, 2003

(65) Prior Publication Data
US 2005/0250050 A1    Nov. 10, 2005

(30) Foreign Application Priority Data
Dec. 17, 2002   (TW) ............................. 91136409 A

(51) Int. Cl.
*G03F 7/00*    (2006.01)
(52) U.S. Cl. ...................... 430/314; 430/312
(58) Field of Classification Search ............... 430/312, 430/314
See application file for complete search history.

(56) References Cited

U.S. PATENT DOCUMENTS

| 5,994,721 A | 11/1999 | Zhong et al. ............... 257/89 |
| 6,031,512 A | 2/2000 | Kadota et al. ............... 345/88 |
| 6,162,654 A | 12/2000 | Kawabe ....................... 438/30 |

FOREIGN PATENT DOCUMENTS

JP              55-58534    *   5/1980

* cited by examiner

*Primary Examiner*—Nicole Barreca
(74) *Attorney, Agent, or Firm*—Birch, Stewart, Kolasch & Birch, LLP

(57) ABSTRACT

A method of forming a top gate thin film transistor (TFT). By performing photolithography using a first reticle, a photoresist layer having a thick photoresist layer portion and a thin photoresist layer portion is formed on a silicon layer in an active area. Thus, a channel layer and source/drain regions in a silicon island are defined by the same patterning process. In addition, a gate and an LDD region in the silicon island are defined by photolithography using a second reticle and a backside exposure process. Accordingly, the top gate TFT fabrication process of the present invention requires only two reticles, and thereby reduces costs.

18 Claims, 14 Drawing Sheets

METHOD OF FORMING A TOP GATE THIN FILM TRANSISTOR

This nonprovisional application claims priority under 35 U.S.C. § 119(a) on Patent Application No(s). 91136409 filed in TAIWAN on Dec. 17, 2002, which is(are) herein incorporated by reference.

BACKGROUND OF THE INVENTION

1. Field of the Invention

The present invention relates to a thin film transistor (TFT) process, and more particularly, to a method of forming a top gate thin film transistor.

2. Description of the Related Art

Thin film transistors (TFTs) are utilized in various fields. For example, a TFT can be used in a liquid crystal display device (LCD) to drive liquid crystals, as a sensor for reading images and the like. Hereinafter, a traditional top gate TFT process will be described, with reference to FIGS. 1A~1D.

In FIG. 1, a transparent substrate 100, such as a glass substrate, is provided. The substrate 100 has a predetermined channel area 105 thereon. By performing a first photolithography procedure using a first reticle, a silicon island 110 is formed on part of the substrate 100.

In FIG. 2, by performing a second photolithography procedure using a second reticle, a photoresist layer 120 is formed on the substrate 100 and part of the silicon island 110. The photoresist layer 110 has an opening 125 exposing the surface of the silicon island 110 in the channel area 105. An ion implantation 130 is performed to implant impurities into the silicon island 110 in the channel area 105, thus a channel layer (also referred to as an active layer) 111 is formed in the silicon island 110. This step functions as a threshold voltage adjustment ($V_t$ adjustment).

In FIG. 1C, an insulating layer 140 is formed on the substrate 100 and the silicon island 110. By performing a third photolithography procedure using a third reticle, a gate 150 is then formed on part of the insulating film 140. Using the gate 150 as a mask, a low-dose ion implantation 160 is performed to form lightly doped drain (LDD) regions 165 in part of the silicon island 110.

In FIG. 1D, by performing a fourth photolithography procedure using a fourth reticle, a photoresist layer 170 is formed on part of the insulating layer 140 and over the gate 150. A high-dose ion implantation 180 is performed to form heavily doped regions 185 in part of the silicon island 110. The heavily doped regions 185 serve as source/drain regions.

Accordingly, the traditional top gate TFT process requires four reticles for patterning the silicon island 110, the photoresist layer 120, the gate 150 and the photoresist layer 170. Thus, the traditional process is complicated and expensive.

SUMMARY OF THE INVENTION

The object of the present invention is to provide a method of forming a top gate thin film transistor (TFT).

Another object of the present invention is to provide a method of forming a top gate TFT, which consumes fewer reticles than the prior art.

In order to achieve these objects, the present invention provides a method of forming a top gate TFT. A transparent substrate having at least one active area thereon is provided, wherein the active area includes a channel area. A silicon layer is formed on the substrate. By performing photolithography using a first reticle, a first photoresist layer is formed on the silicon layer in the active area, wherein the first photoresist layer has a thick photoresist layer portion and a thin photoresist layer portion, and the thin photoresist layer portion corresponds to the channel area. Using the first photoresist layer as a mask, part of the silicon layer is removed to form a silicon island on the substrate in the active area, and simultaneously, the thin photoresist layer portion is removed to expose the silicon island in the channel area. Using the thick photoresist layer portion as a mask, impurities are implanted into the silicon island in the channel area. The thick photoresist layer portion is removed. A gate insulating layer is formed on the silicon island and the substrate. By performing photolithography using a second reticle, a metal layer is formed on the gate insulating layer in the channel area. Using the metal layer as a mask, a high-dose ion implantation is performed to form a source region and a drain region in part of the silicon island. A second photoresist layer is formed on the metal layer and the gate insulating layer. A visible light-scattering source is provided to perform a backside exposure process on the second photoresist layer. Part of the second photoresist layer is removed to form a remaining second photoresist layer on part of the metal layer exposing a partial surface thereof. Using the remaining second photoresist layer as a mask, part of the metal layer is removed to form a gate on the gate insulating layer. Using the gate as a mask, and a low-dose ion implantation is performed to form a lightly doped drain (LDD) region in part of the silicon island.

The present invention provides another method of forming a top gate TFT. A transparent substrate having at least one active area thereon is provided, wherein the active area includes a channel area and a source/drain area. A silicon layer is formed on the substrate. By performing photolithography using a first reticle, a first photoresist layer is formed on the silicon layer in the active area, wherein the first photoresist layer has a thick photoresist layer portion and a thin photoresist layer portion, and the thick photoresist layer portion corresponds to the channel area. Using the first photoresist layer as a mask, part of the silicon layer is removed to form a silicon island on the substrate in the active area, and simultaneously, the thin photoresist layer portion is removed to expose the silicon island in the source/drain area. Using the thick photoresist layer portion as a mask, a high-dose ion implantation is performed to form a source region and a drain region in part of the silicon island. The thick photoresist layer portion is removed. A gate insulating layer is formed on the silicon island and the substrate. By performing photolithography using a second reticle, a metal layer is formed on the gate insulating layer in the channel area. A second photoresist layer is formed on the metal layer and the gate insulating layer. A visible light-scattering source is provided to perform a backside exposure process on the second photoresist layer. Part of the second photoresist layer is removed to form a remaining second photoresist layer on part of the metal layer exposing a partial surface thereof. Using the remaining second photoresist layer as a mask, part of the metal layer is removed to form a gate on the gate insulating layer. Using the gate as a mask, a low-dose ion implantation is performed to form a lightly doped drain (LDD) region in part of the silicon island.

The present invention provides still another method of forming a top gate TFT. A transparent substrate having at least one active area thereon is provided, wherein the active area includes a channel area and a source/drain area. A silicon layer is formed on the substrate. An insulating layer is formed on the silicon layer. A first metal layer is formed on the insulating layer. By performing photolithography using a reticle, a first photoresist layer is formed on the first metal layer in the active area, wherein the first photoresist layer has a thick photoresist layer portion and a thin photoresist layer portion, and the thick photoresist layer portion corresponds to the channel area. Using the first photoresist layer as a mask, part of the first metal layer, part of the insulating layer and part of the silicon layer are removed to form a remaining first metal layer, agate insulating layer and a silicon island, and simultaneously, the thin photoresist layer portion is removed to expose the remaining first metal layer in the source/drain area. Using the thick photoresist layer portion as a mask, part of the remaining first metal layer is removed to form a second metal layer on the gate insulating layer exposing a top surface thereof in the source/drain area. Using the second metal layer as a mask, a high-dose ion implantation is performed to form a source region and a drain region in part of the silicon island. The thick photoresist layer portion is removed. A second photoresist layer is formed on the second metal layer and the gate insulating layer. A visible light-scattering source is provided to perform a backside exposure process on the second photoresist layer. Part of the second photoresist layer is removed to form a remaining second photoresist layer on part of the second metal layer exposing a partial surface thereof. Using the remaining second photoresist layer as a mask, part of the second metal layer is removed to form a gate on the gate insulating layer. Using the gate as a mask, a low-dose ion implantation is performed to form a lightly doped drain (LDD) region in part of the silicon island.

The present invention improves on the prior art in that the present method requires only one or two reticles to fabricate the top gate TFT. Thus, the present invention can decrease reticle consumption, and thereby reduce costs.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Reference will now be made in detail to the preferred embodiments of the present invention, examples of which are illustrated in the accompanying drawings.

FIRST EMBODIMENT

FIGS. 2A~2H are sectional views showing the top gate TFT process according to the first embodiment of the present invention.

Figure 1A:
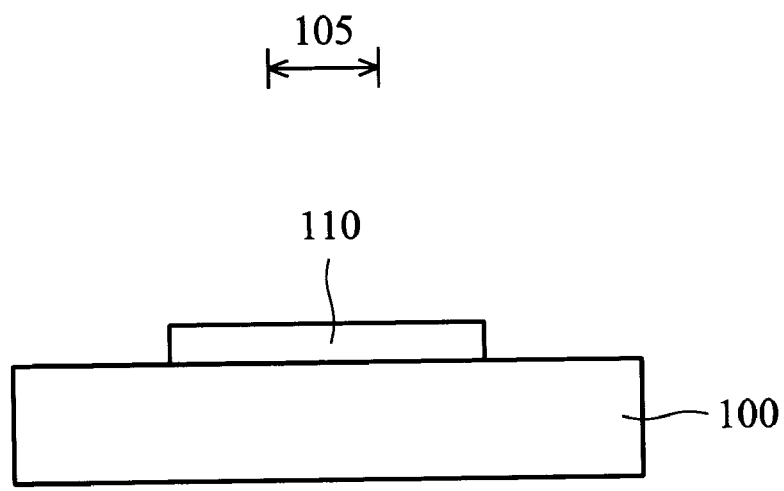
FIGS. 1A~1D are sectional views showing the traditional top gate TFT process.
Figure 1B:
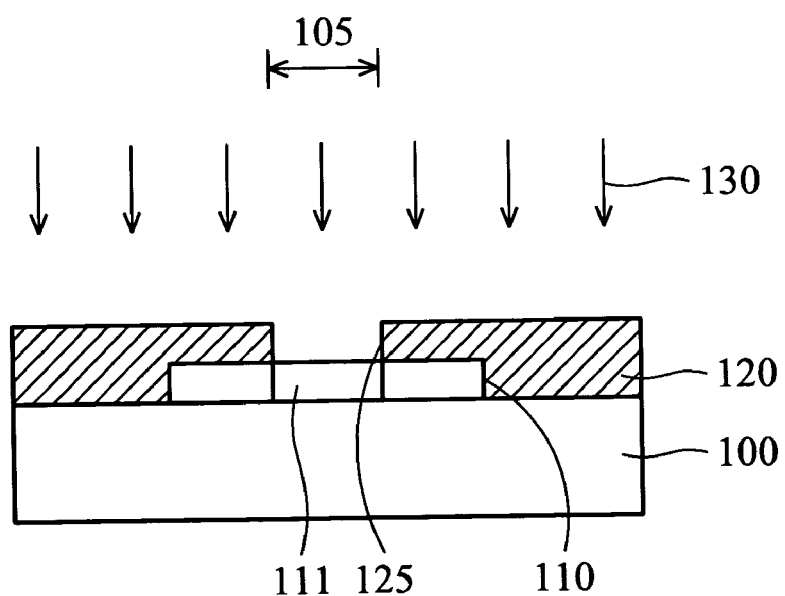
Figure 1C:
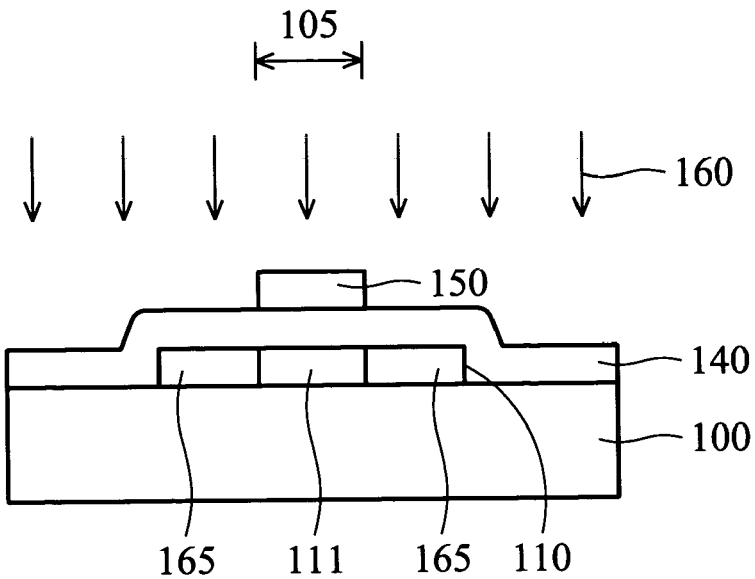
Figure 1D:
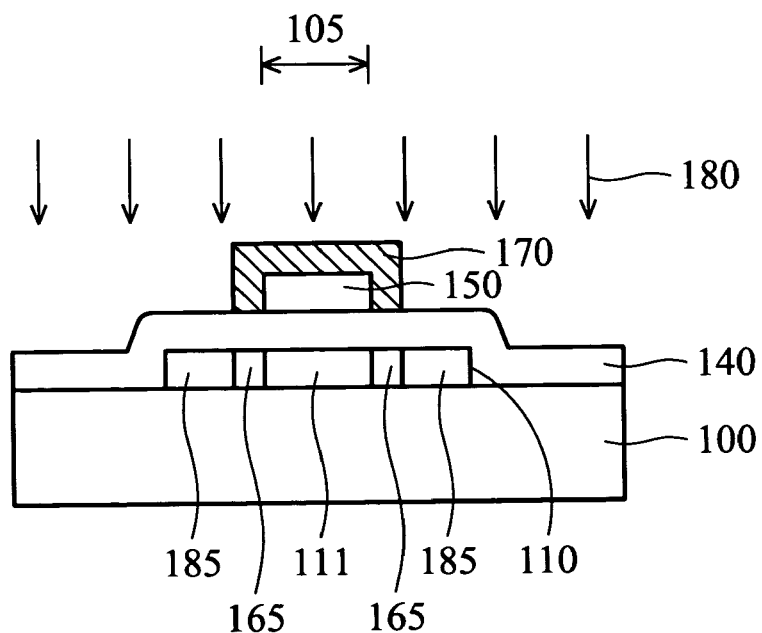
Figure 2A:
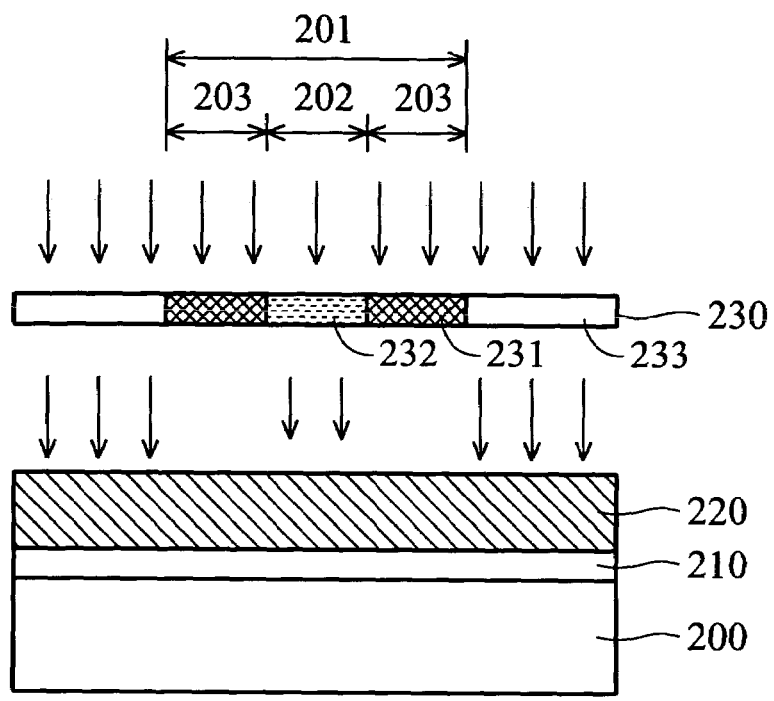
FIGS. 2A~2H are sectional views showing the top gate TFT process according to a first embodiment of the present invention.

In FIG. 2A, a transparent insulating substrate 200 having at least one predetermined active area 201 thereon is provided, wherein the active area 201 includes a channel area 202 and a source/drain area 203. The transparent insulating substrate 200 can be a glass substrate. A silicon layer 210, such as amorphous silicon or polysilicon, is then formed on the substrate 200.

Figure 2B:
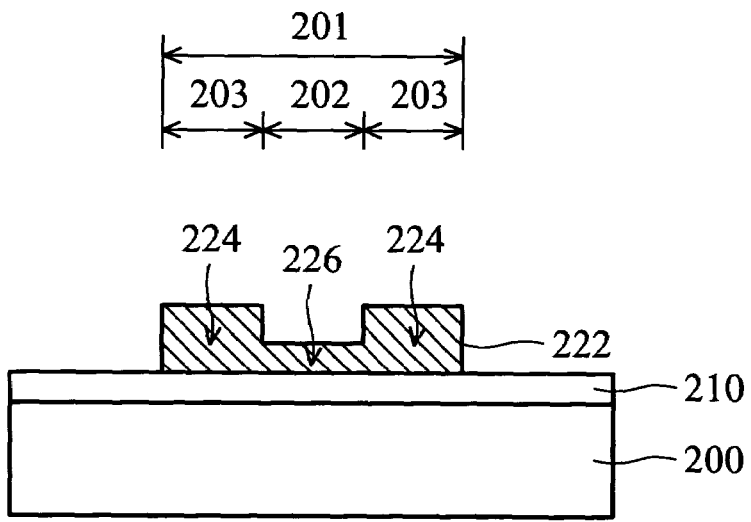

In FIGS. 2A and 2B, a positive photoresist layer 220 is formed on the silicon layer 210. By performing photolithography (patterning procedure) using a first reticle 230, a first photoresist layer 222 is formed on the silicon layer 210 in the active area 201, wherein the first photoresist layer 222 has a thick photoresist layer portion 224 and a thin photoresist layer portion 226, and the thin photoresist layer portion 226 corresponds to the channel area 202.

It should be noted that, referring to FIG. 2A, the first reticle 230 includes an opaque portion 231, a translucent portion 232 and a transparent portion 233, wherein the opaque portion 231 corresponds to the thick photoresist layer portion 224 and the translucent portion 232 corresponds to the thin photoresist layer portion 226. Additionally, the first reticle 230 can be a slit mask, a gray tone mask or a phase shifting mask. That is, the present invention does not intend to limit the type of mask used as a first reticle 230.

Figure 2C:
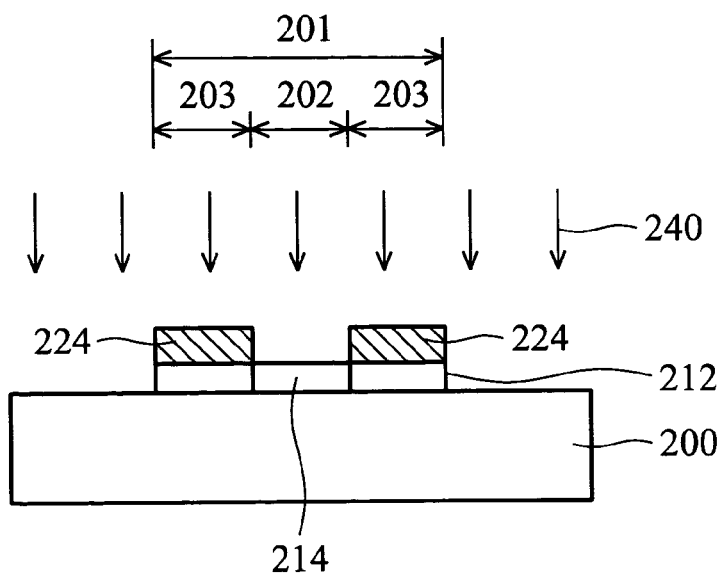

In FIGS. 2B and 2C, using the first photoresist layer 222 as a mask, part of the silicon layer 210 is removed to form a silicon island 212 on the substrate 200 in the active area 201. Simultaneously, the thin photoresist layer portion 226 is etched to expose the surface of the silicon island 212 in the channel area 202.

In FIG. 2C, using the thick photoresist layer portion 224 as a mask, an ion implantation 240 is performed to implant impurities into the silicon island 212 in the channel area 202. Thus, a channel layer (also referred to as an active layer) 214 is formed in the silicon island 212. This step functions as a TFT threshold voltage adjustment ($V_t$ adjustment). The thick photoresist layer portion 224 is then removed.

Figure 2D:
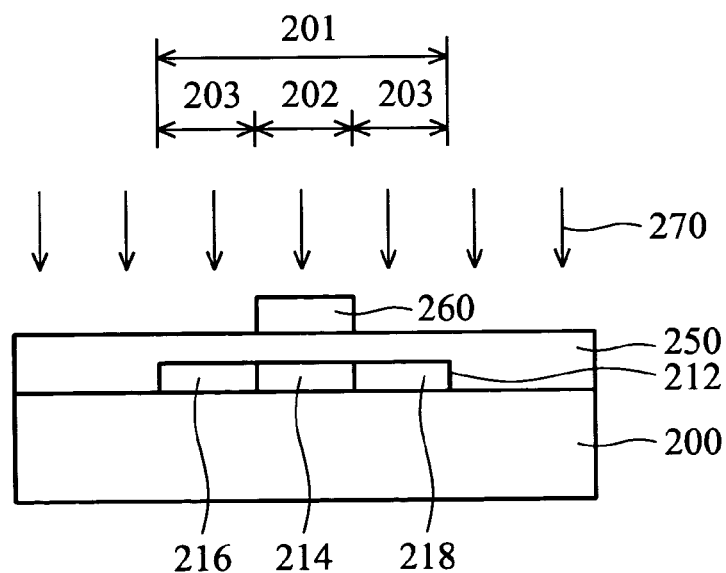

In FIG. 2D, a gate insulating layer 250, such as $SiO_2$, is formed on the silicon island 212 and the substrate 200. By performing photolithography using a second reticle, a metal layer 260, such as Al or Mo, is formed on the gate insulating layer 250 in the channel area 202.

In FIG. 2D, using the metal layer 260 as a mask, a high-dose ion implantation 270 is performed to form a source region 216 and a drain region 218 in part of the silicon island 212.

Figure 2E:
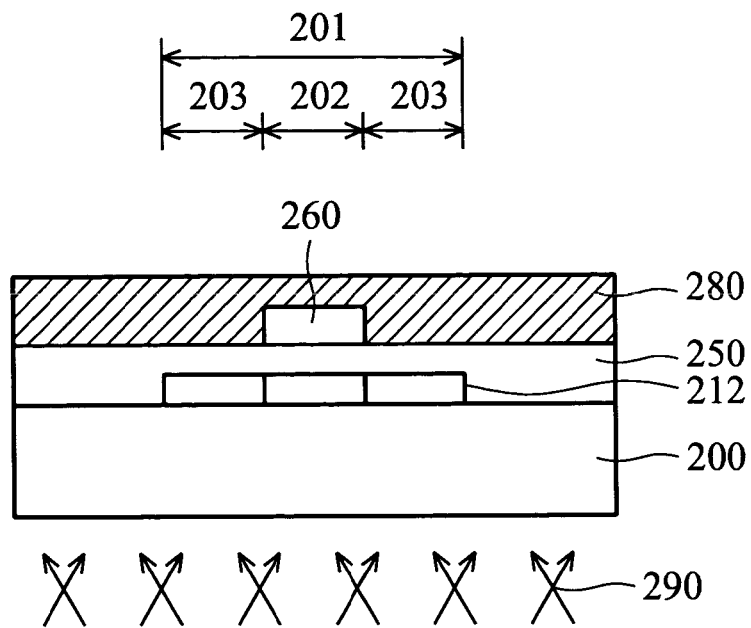

In FIG. 2E, a second photoresist layer 280 is formed on the metal layer 260 and the gate insulating layer 250. A visible light source (not shown) for isotropic scattering, provided to perform a backside exposure process 290 on the second photoresist layer 280. It should be noted that the visible scattering light (290) is able to pass through the silicon island 212 since the wavelength of the visible light is about 250~800 nm.

Figure 2F:
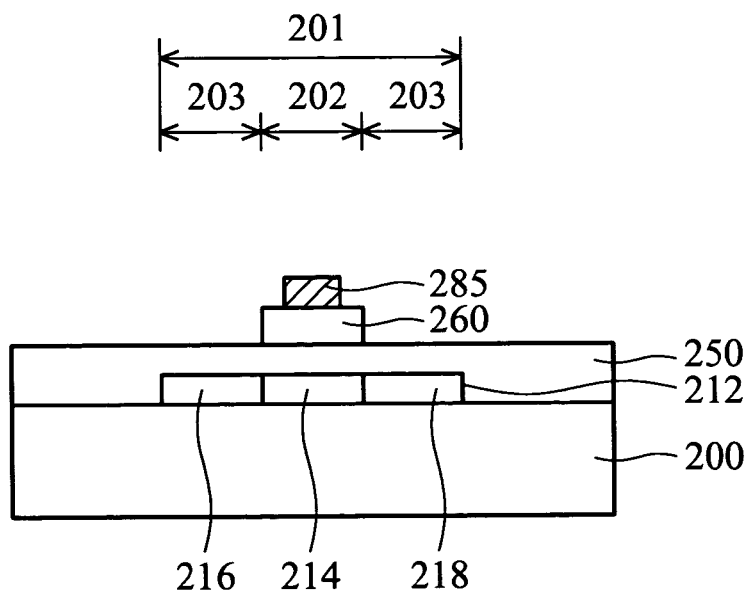

In FIG. 2F, after the backside exposure process 290, part of the second photoresist layer 280 is then removed to form a remaining second photoresist layer 285 on part of the metal layer 260 exposing a partial surface thereof.

Figure 2G:
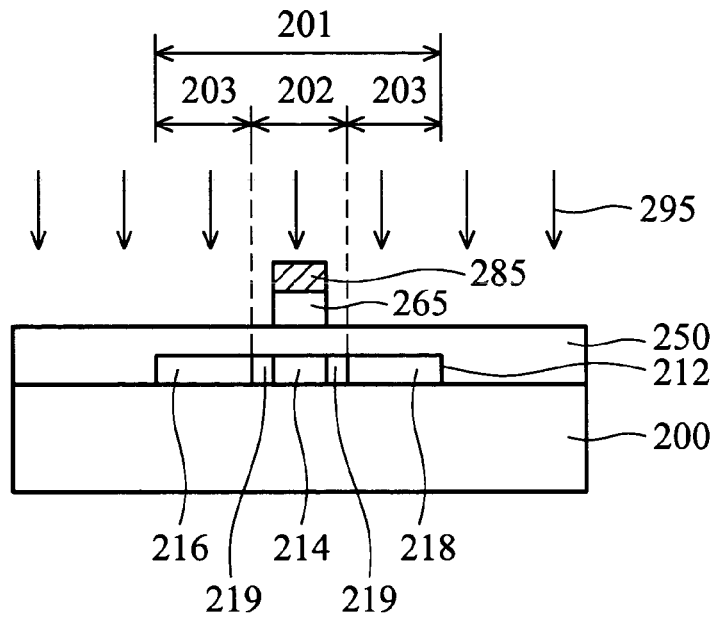

In FIG. 2G, using the remaining second photoresist layer 285 as a mask, part of the metal layer 260 is removed to form a gate 265 on the gate insulating layer 250. Using the gate 265 as a mask, a low-dose ion implantation 295 is performed to form a lightly doped drain (LDD) region 219 in the silicon island 212 on either side of the gate 265. That is, the LDD region 219 is formed between the channel layer 214 and the source/drain regions 216/218.

Figure 2H:
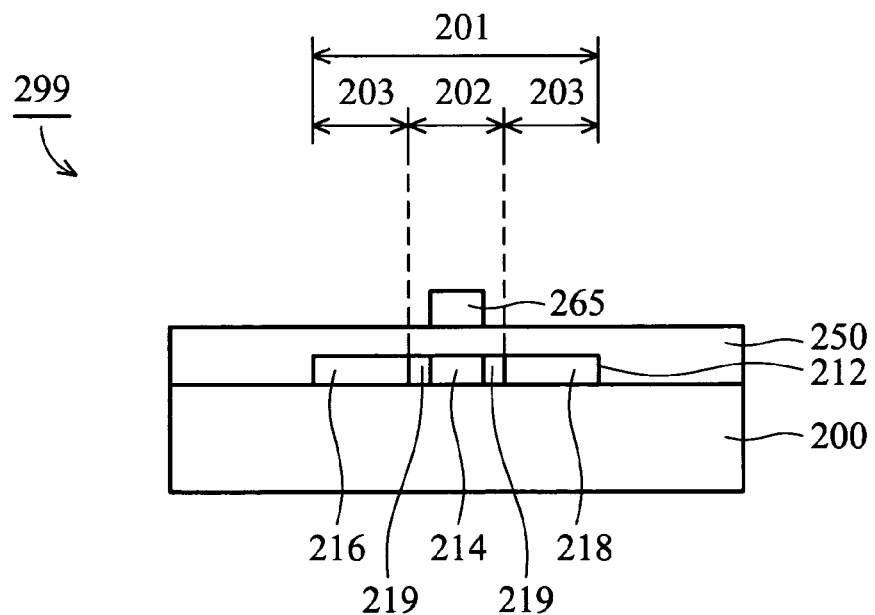

In FIG. 2H, the remaining second photoresist layer 285 is removed by etching. According to the first embodiment, a top gate TFT device 299 is thus obtained by utilizing only two reticles.

SECOND EMBODIMENT

FIGS. 3A~3H are sectional views showing the top gate TFT process according to the second embodiment of the present invention.

Figure 3A:
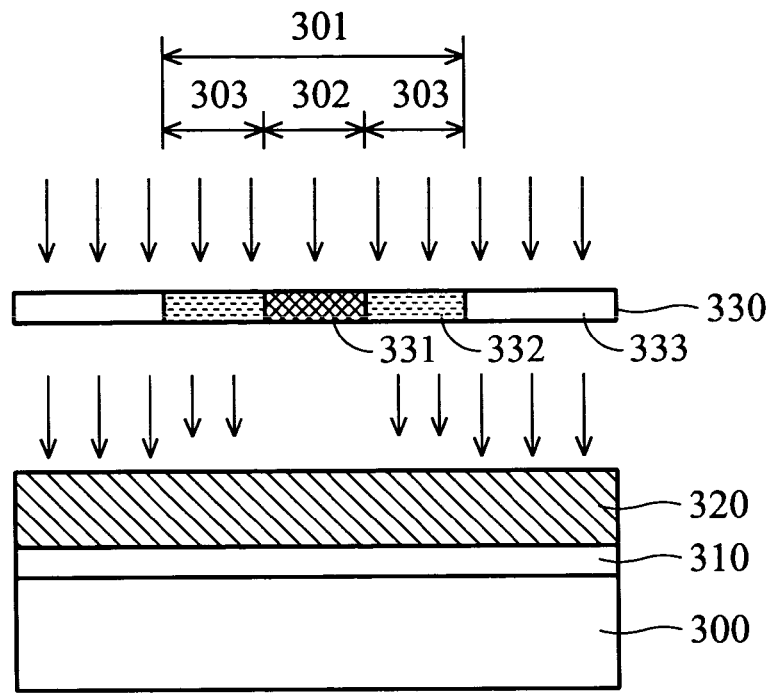
FIGS. 3A~3H are sectional views showing the top gate TFT process according to a second embodiment of the present invention.

In FIG. 3A, a transparent insulating substrate 300 having at least one predetermined active area 301 thereon is provided, wherein the active area 301 includes a channel area 302 and a source/drain area 303. The transparent insulating substrate 300 can be a glass substrate. Then, a silicon layer 310, such as amorphous silicon or polysilicon, is formed on the substrate 300.

Figure 3B:
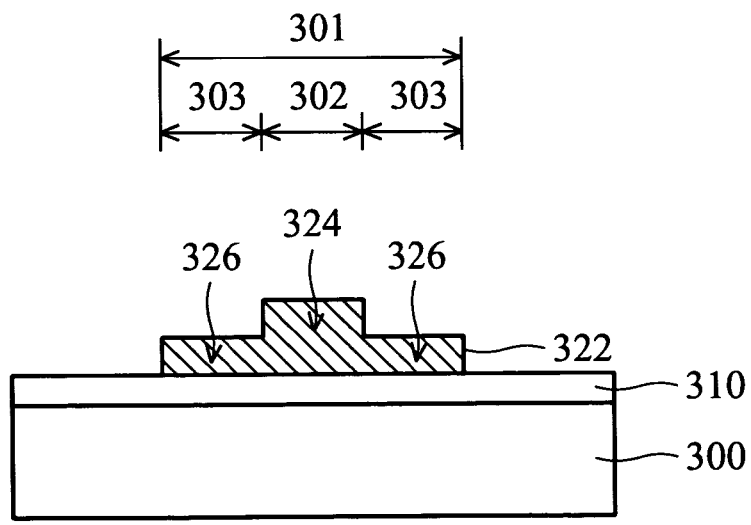

In FIGS. 3A and 3B, a positive photoresist layer 320 is formed on the silicon layer 310. By performing photolithography (patterning procedure) using a first reticle 330, a first photoresist layer 322 is formed on the silicon layer 310 in the active area 301, wherein the first photoresist layer 322 has a thick photoresist layer portion 324 and a thin photoresist layer portion 326, and the thick photoresist layer portion 324 corresponds to the channel area 302.

It should be noted that, referring to FIG. 3A, the first reticle 330 includes an opaque portion 331, a translucent portion 332 and a transparent portion 333, wherein the opaque portion 331 corresponds to the thick photoresist layer portion 324 and the translucent portion 332 corresponds to the thin photoresist layer portion 326. Additionally, the first reticle 330 can be a slit mask, a gray tone mask or a phase shifting mask. That is, the present invention does not intend to limit the type of mask used as the first reticle 330.

Figure 3C:
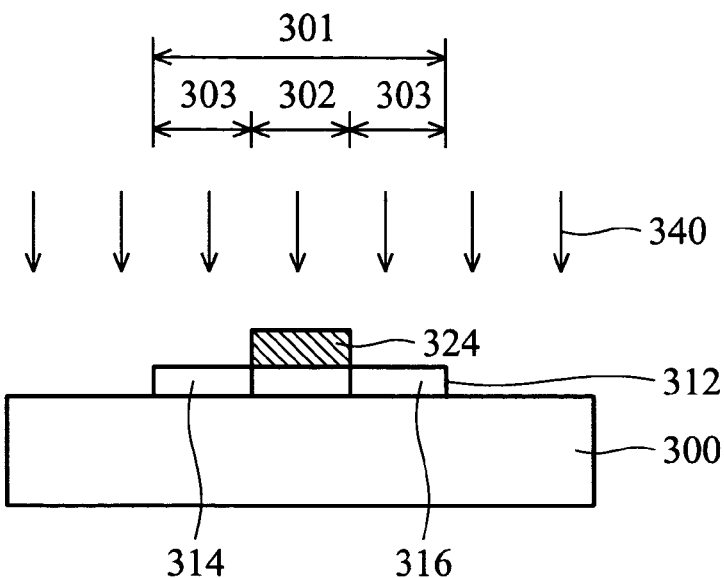

In FIGS. 3B and 3C, using the first photoresist layer 322 as a mask, part of the silicon layer 310 is removed to form a silicon island 312 on the substrate 300 in the active area 301. Simultaneously, the thin photoresist layer portion 326 is etched to expose the surface of the silicon island 312 in the source/drain area 303.

In FIG. 3C, using the thick photoresist layer portion 324 as a mask, a high-dose ion implantation 340 is performed to form a source region 314 and a drain region 316 in part of the silicon island 312. Then, the thick photoresist layer portion 324 is removed.

Figure 3D:
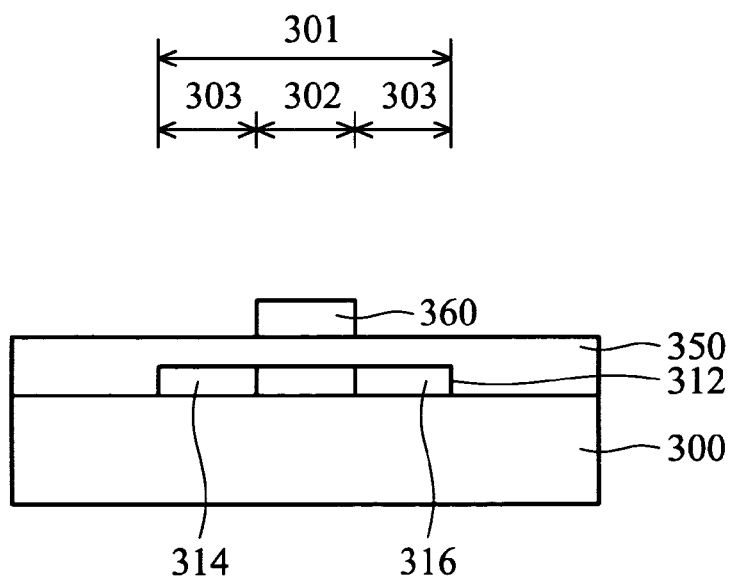

In FIG. 3D, a gate insulating layer 350, such as SiO$_2$, is formed on the silicon island 312 and the substrate 300. By performing photolithography using a second reticle, a metal layer 360, such as Al or Mo, is formed on the gate insulating layer 350 in the channel area 302.

Figure 3E:
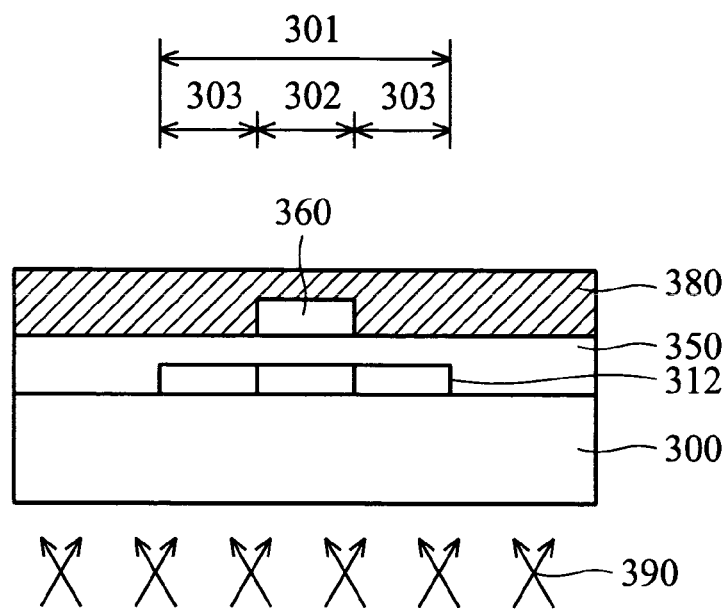

In FIG. 3E, a second photoresist layer 380 is formed on the metal layer 360 and the gate insulating layer 350. A visible light source (not shown) for isotropic scattering, is provided to perform a backside exposure process 390 on the second photoresist layer 380. It should be noted that the visible scattering light (390) can pass through the silicon island 312 since the wavelength of the visible light is about 250~800 nm.

Figure 3F:
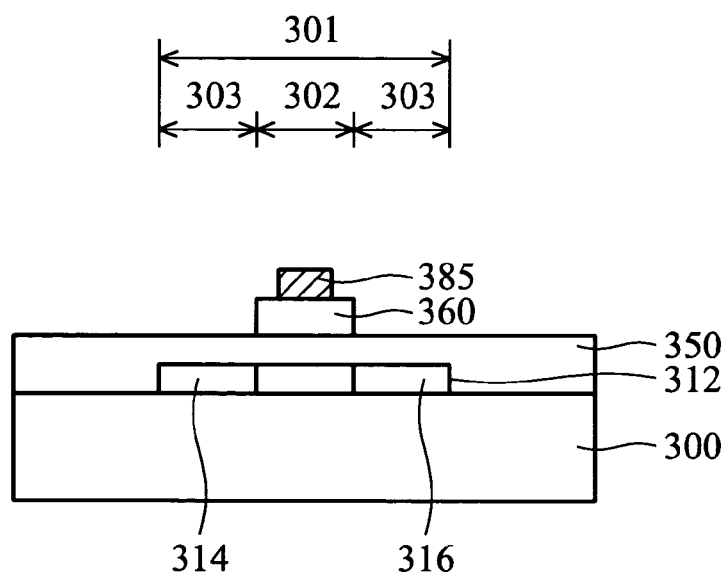

In FIG. 3F, after the backside exposure process 390, part of the second photoresist layer 380 is removed to form a remaining second photoresist layer 385 on part of the metal layer 360 exposing a partial surface thereof.

Figure 3G:
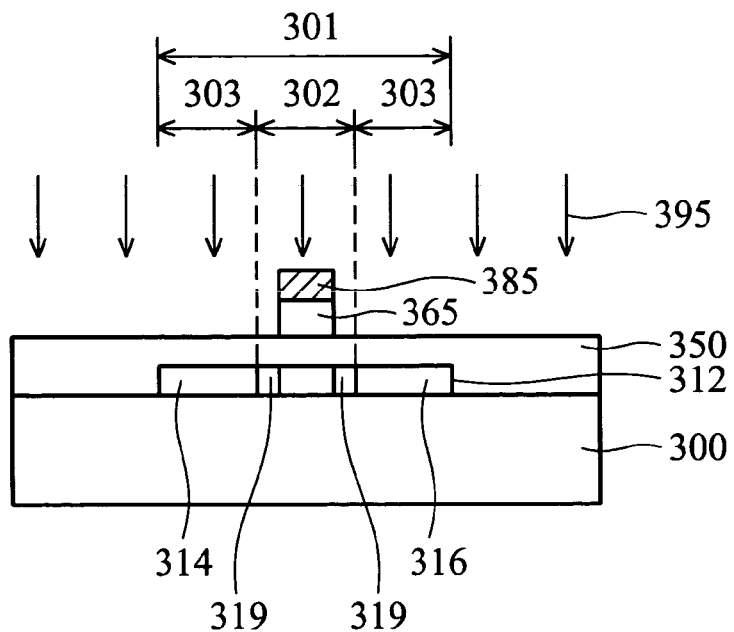

In FIG. 3G, using the remaining second photoresist layer 385 as a mask, part of the metal layer 360 is removed to form a gate 365 on the gate insulating layer 350. Using the gate 365 as a mask, a low-dose ion implantation 395 is performed to form a lightly doped drain (LDD) region 319 in the silicon island 312 on either side of the gate 365.

Figure 3H:
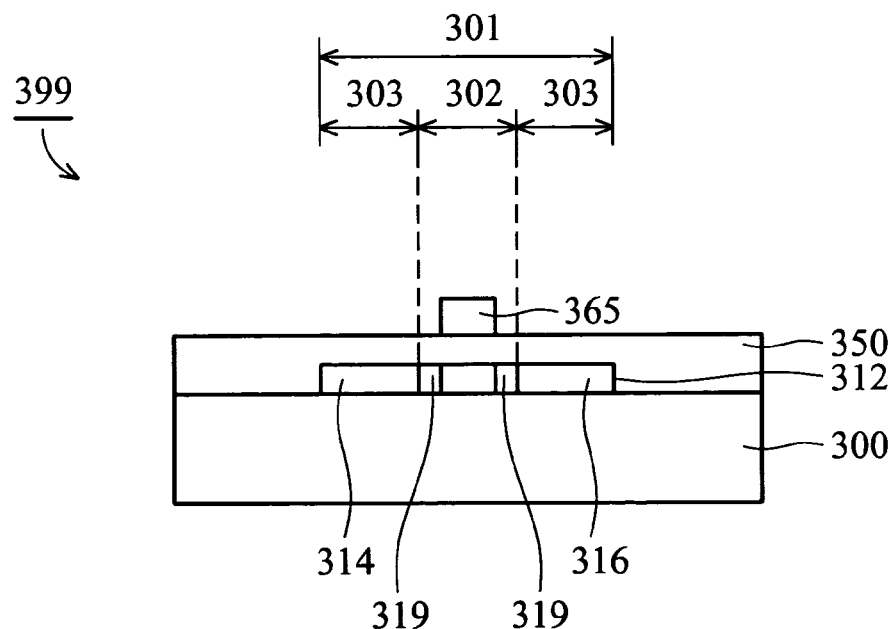

In FIG. 3H, the remaining second photoresist layer 385 is removed by etching. According to the second embodiment, a top gate TFT device 399 is thus obtained by utilizing only two reticles.

THIRD EMBODIMENT

FIGS. 4A~4H are sectional views showing the top gate TFT process according to the third embodiment of the present invention.

Figure 4A:
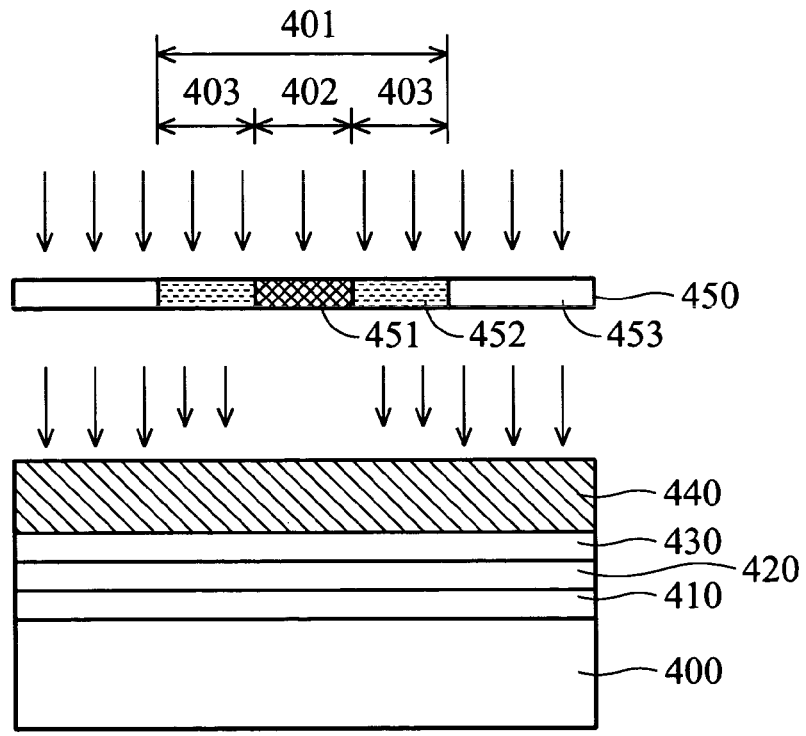
FIGS. 4A~4H are sectional views showing the top gate TFT process according to a third embodiment of the present invention.

In FIG. 4A, a transparent insulating substrate 400 having at least one predetermined active area 401 thereon is provided, wherein the active area 401 includes a channel area 402 and a source/drain area 403. The transparent insulating substrate 400 can be a glass substrate. A silicon layer 410, such as amorphous silicon or polysilicon, is then formed on the substrate 400. An insulating layer 420, such as SiO$_2$, is formed on the silicon layer 420. A first metal layer 430, such as Al or Mo, is next formed on the insulating layer 420.

Figure 4B:
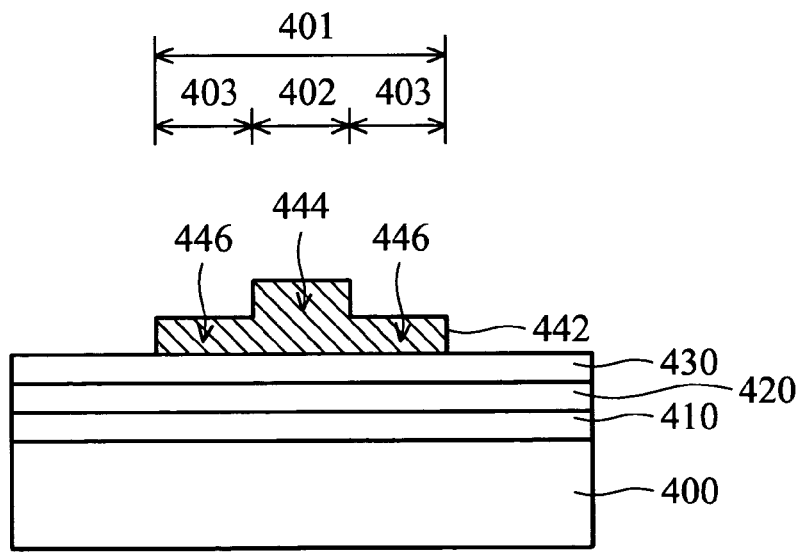

In FIGS. 4A and 4B, a positive photoresist layer 440 is formed on the first metal layer 430. By performing photolithography (patterning procedure) using a reticle 450, a first photoresist layer 442 is formed on the first metal layer 430 in the active area 401, wherein the first photoresist layer 442 has a thick photoresist layer portion 444 and a thin photoresist layer portion 446, and the thick photoresist layer portion 444 corresponds to the channel area 402.

It should be noted that, referring to FIG. 4A, the reticle 450 includes an opaque portion 451, a translucent portion 452 and a transparent portion 453, wherein the opaque portion 451 corresponds to the thick photoresist layer portion 444 and the translucent portion 452 corresponds to the thin photoresist layer portion 446. Additionally, the reticle 450 can be a slit mask, a gray tone mask or a phase shifting mask. That is, the present invention does not intend to limit the type of the reticle 450.

Figure 4C:
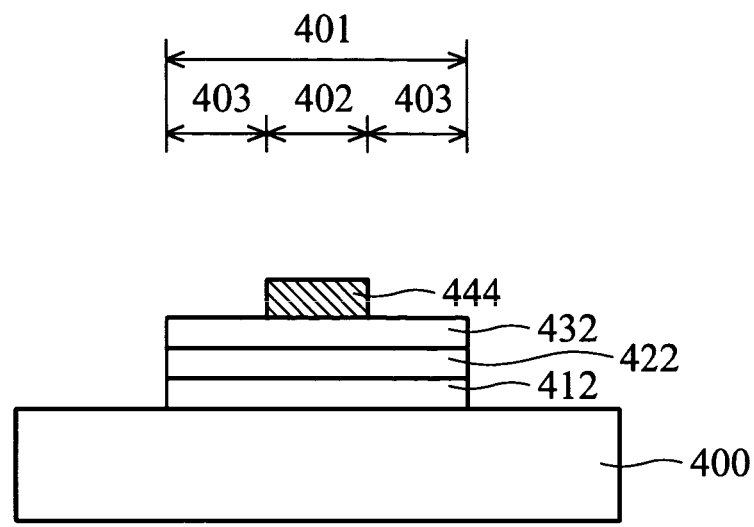

In FIGS. 4B and 4C, using the first photoresist layer 442 as a mask, part of the first metal layer 430, part of the insulating layer 420 and part of the silicon layer 410 are removed to form a remaining first metal layer 432, a gate insulating layer 422 and a silicon island 412. Simultaneously, the thin photoresist layer portion 446 is etched to expose the remaining first metal layer 432 in the source/drain area 403.

Figure 4D:
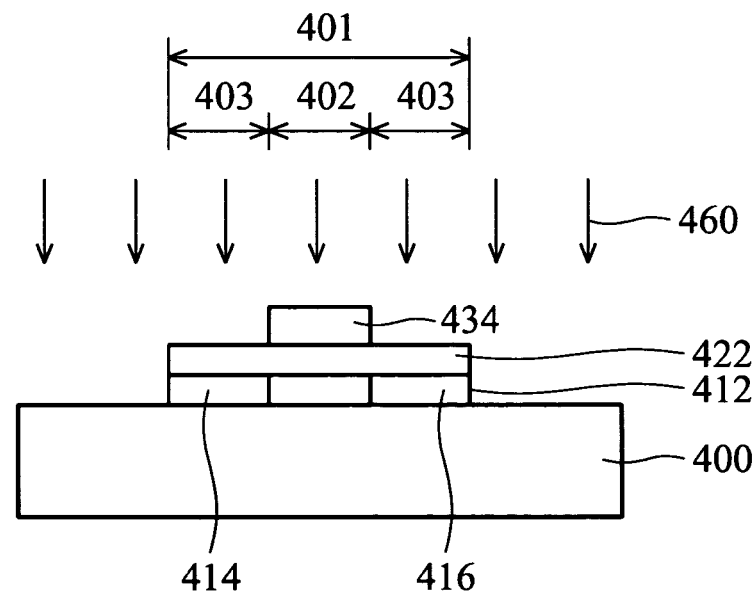

In FIGS. 4C and 4D, using the thick photoresist layer portion 444 as a mask, part of the remaining first metal layer 432 is removed to form a second metal layer 434 on the gate insulating layer 422 exposing a top surface thereof in the source/drain area 430.

In FIG. 4D, using the second metal layer 434 as a mask, a high-dose ion implantation 460 is performed to form a source region 414 and a drain region 416 in part of the silicon island 412. The thick photoresist layer portion 444 is then removed.

Figure 4E:
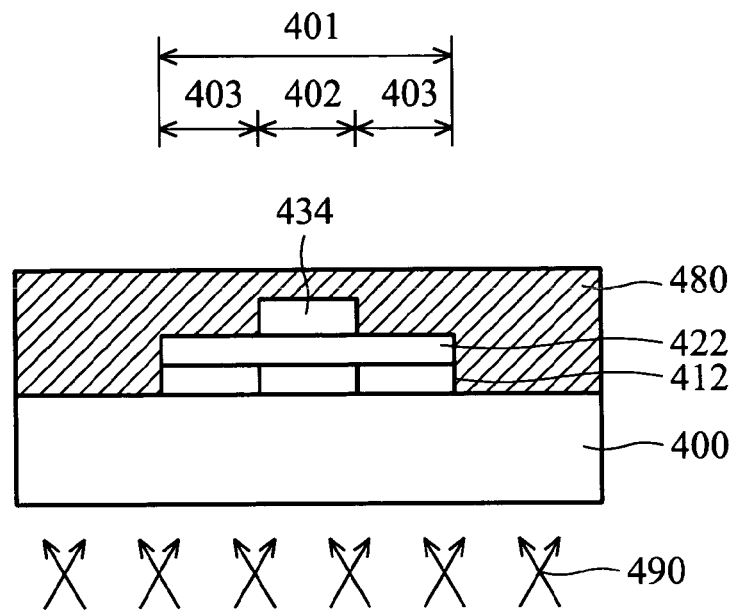

In FIG. 4E, a second photoresist layer 480 is formed on the second metal layer 434, the gate insulating layer 422 and the substrate 400. A visible light source (not shown) for isotropic scattering, is provided to perform a backside exposure process 490 on the second photoresist layer 480. It should be noted that the visible scattering light (490) can pass through the silicon island 412 since the wavelength of the visible light is about 250~800 nm.

Figure 4F:
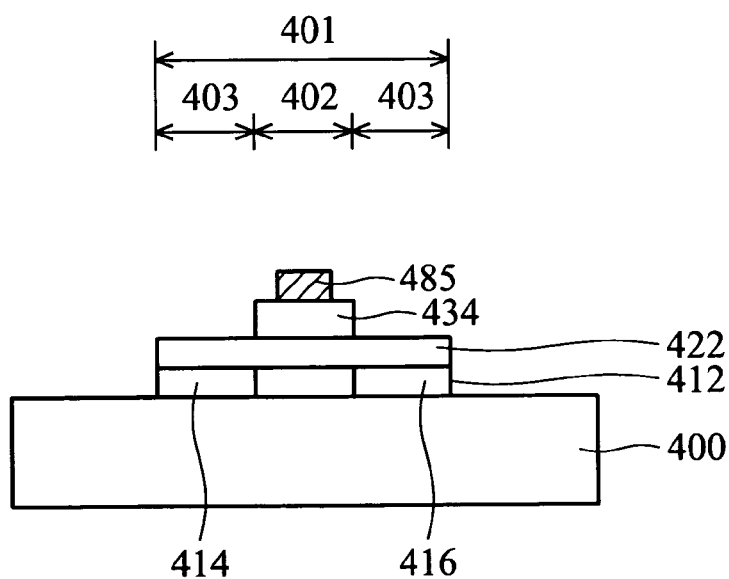

In FIG. 4F, after the backside exposure process 490, part of the second photoresist layer 480 is removed to form a remaining second photoresist layer 485 on part of the second metal layer 434 exposing a partial surface thereof.

Figure 4G:
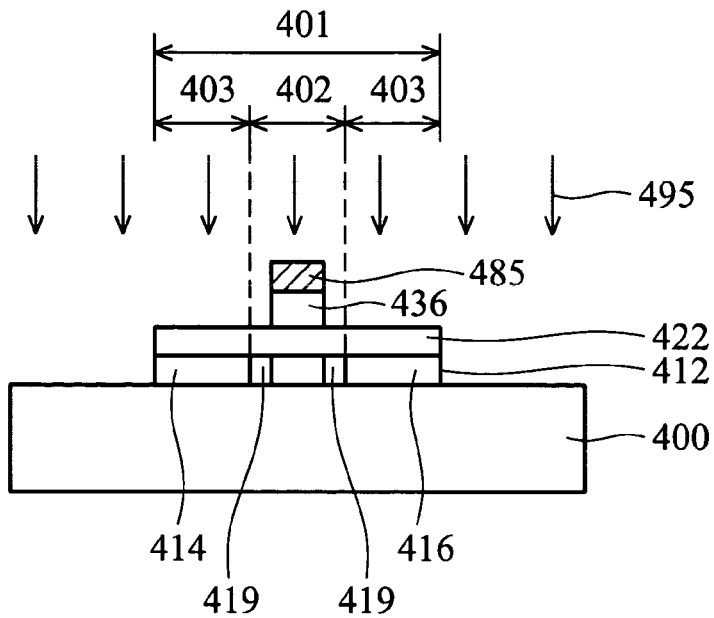

In FIG. 4G, using the remaining second photoresist layer 485 as a mask, part of the second metal layer 434 is removed to form a gate 436 on the gate insulating layer 422. Using the gate 436 as a mask, a low-dose ion implantation 495 is performed to form a lightly doped drain (LDD) region 419 in part of the silicon island 412 on either side of the gate 436.

Figure 4H:
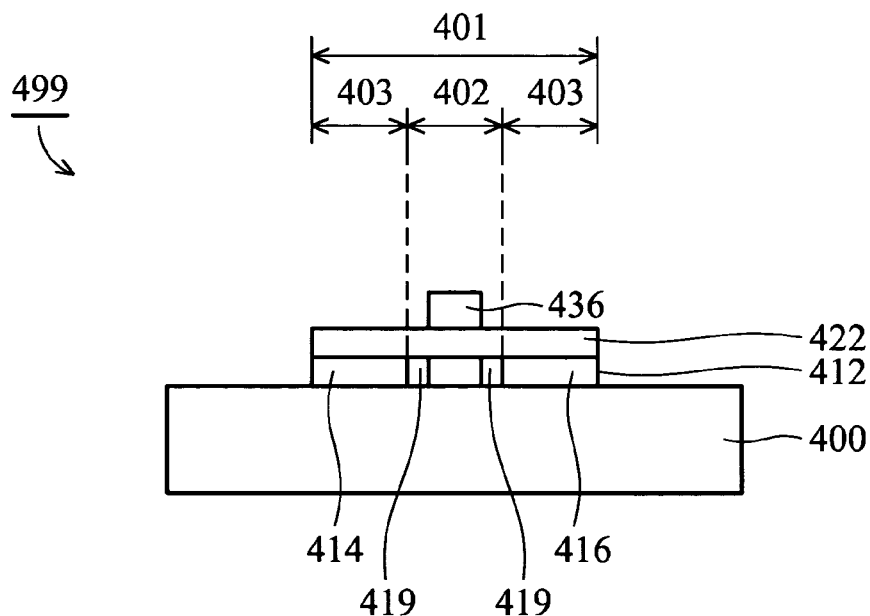

In FIG. 4H, the remaining second photoresist layer 485 is removed by etching. According to the third embodiment, a top gate TFT device 499 is thus obtained by utilizing only one reticle.

The present invention improves on the prior art in that the present method uses a photoresist layer having a thick photoresist layer portion and a thin photoresist layer portion to define a silicon layer including a channel layer and source/drain regions. In addition, the present method uses a backside exposure process to define LDD regions in the silicon island. Thus, the present method requires only one or two reticles to fabricate a top gate TFT, thereby decreasing reticle consumption and cost.

Finally, while the invention has been described by way of example and in terms of the above, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of forming a top gate thin film transistor (TFT), comprising the steps of:
   providing a transparent substrate having at least one active area thereon, wherein the active area includes a channel area;
   forming a silicon layer on the substrate;
   using a first reticle, and forming a first photoresist layer on the silicon layer in the active area, wherein the first photoresist layer has a thick photoresist layer portion and a thin photoresist layer portion, and the thin photoresist layer portion corresponds to the channel area;
   using the first photoresist layer as a mask, removing part of the silicon layer to form a silicon island on the substrate in the active area, and removing the thin photoresist layer portion to expose the silicon island in the channel area;
   using the thick photoresist layer portion as a mask, implanting impurities into the silicon island in the channel area;
   removing the thick photoresist layer portion;
   forming a gate insulating layer on the silicon island and the substrate;
   using a second reticle, forming a metal layer on the gate insulating layer in the channel area; and
   using the metal layer as a mask, performing a high-dose ion implantation to form a source region and a drain region in part of the silicon island.

2. The method according to claim 1, further comprising the steps of:
   forming a second photoresist layer on the metal layer and the gate insulating layer;
   providing a visible light-scattering source to perform a backside exposure process on the second photoresist layer;
   removing part of the second photoresist layer to form a remaining second photoresist layer on part of the metal layer exposing a partial surface thereof;
   using the remaining second photoresist layer as a mask, removing part of the metal layer to form a gate on the gate insulating layer; and
   using the gate as a mask, performing a low-dose ion implantation to form a lightly doped drain (LDD) region in part of the silicon island.

3. The method according to claim 1, wherein the silicon layer is an amorphous silicon layer or a polysilicon layer.

4. The method according to claim 1, wherein the first reticle includes an opaque
   portion, a translucent portion and a transparent portion, wherein the opaque portion corresponds to the thick photoresist layer portion and the translucent portion corresponds to the thin photoresist layer portion.

5. The method according to claim 2, wherein the gate insulating layer is a $SiO_2$ layer.

6. The method according to claim 2, wherein a wavelength of the visible light-scattering source is 250~800 nm.

7. A method of forming a top gate thin film transistor (TFT), comprising the steps of:
   providing a transparent substrate having at least one active area thereon, wherein the active area includes a channel area and a source/drain area;
   forming a silicon layer on the substrate;
   using a first reticle, forming a first photoresist layer on the silicon layer in the active area, wherein the first photoresist layer has a thick photoresist layer portion and a thin photoresist layer portion, and the thick photoresist layer portion corresponds to the channel area;
   using the first photoresist layer portion as a mask, removing part of the silicon layer to form a silicon island on the substrate in the active area, and removing the thin photoresist layer portion to expose the silicon island in the source/drain area;
   using the thick photoresist layer portion as a mask, performing a high-dose ion implantation to form a source region and a drain region in part of the silicon island; and
   removing the thick photoresist layer portion.

8. The method according to claim 7, further comprising the steps of:
   forming a gate insulating layer on the silicon island and the substrate;
   using a second reticle, forming a metal layer on the gate insulating layer in the channel area;
   forming a second photoresist layer on the metal layer and the gate insulating layer;
   providing a visible light-scattering source to perform a backside exposure process on the second photoresist layer;

removing part of the second photoresist layer to form a remaining second photoresist layer on part of the metal layer exposing a partial surface thereof;

using the remaining second photoresist layer as a mask, removing part of the metal layer to form a gate on the gate insulating layer; and using the gate as a mask, performing a low-dose ion implantation to form a lightly doped drain (LDD) region in part of the silicon island.

9. The method according to claim 7, wherein the silicon layer is an amorphous silicon layer or a polysilicon layer.

10. The method according to claim 7, wherein the first reticle includes an opaque portion, a translucent portion and a transparent portion, wherein the opaque portion corresponds to the thick photoresist layer portion and the translucent portion corresponds to the thin photoresist layer portion.

11. The method according to claim 8, wherein the gate insulating layer is a $SiO_2$ layer.

12. The method according to claim 8, wherein a wavelength of the visible light-scattering source is 250~800 nm.

13. A method of forming a top gate thin film transistor (TFT), comprising the steps of:

providing a transparent substrate having at least one active area thereon, wherein the active area includes a channel area and a source/drain area;

forming a silicon layer on the substrate;

forming an insulating layer on the silicon layer;

forming a first metal layer on the insulating layer;

using a reticle, forming a first photoresist layer on the first metal layer in the active area, wherein the first photoresist layer has a thick photoresist layer portion and a thin photoresist layer portion, and the thick photoresist layer portion corresponds to the channel area;

using the first photoresist layer as a mask, removing part of the first metal layer, part of the insulating layer and part of the silicon layer to form a remaining first metal layer, a gate insulating layer and a silicon island, and removing the thin photoresist layer portion to expose the remaining first metal layer in the source/drain area;

using the thick photoresist layer portion as a mask, removing part of the remaining first metal layer to form a second metal layer on the gate insulating layer exposing a top surface thereof in the source/drain area;

using the second metal layer as a mask, performing a high-dose ion implantation to form a source region and a drain region in part of the silicon island; and removing the thick photoresist layer portion.

14. The method according to claim 13, further comprising the steps of:

forming a second photoresist layer on the second metal layer and the gate insulating layer;

providing a visible light-scattering source to perform a backside exposure process on the second photoresist layer;

removing part of the second photoresist layer to form a remaining second photoresist layer on part of the second metal layer exposing a partial surface thereof;

using the remaining second photoresist layer as a mask, removing part of the second metal layer to form a gate on the gate insulating layer; and using the gate as a mask, performing a low-dose ion implantation to form a lightly doped drain (LDD) region in part of the silicon island.

15. The method according to claim 13, wherein the silicon layer is an amorphous silicon layer or a polysilicon layer.

16. The method according to claim 13, wherein the reticle includes an opaque portion, a translucent portion and a transparent portion, wherein the opaque portion corresponds to the thick photoresist layer portion and the translucent portion corresponds to the thin photoresist layer portion.

17. The method according to claim 13, wherein the gate insulating layer is a $SiO_2$ layer.

18. The method according to claim 14, wherein a wavelength of the visible light-scattering source is 250~800 nm.

* * * * *